MASS INTERCONNECTION DEVICE

Filed April 10, 1967 3 Sheets-Sheet 1

INVENTORS
LEON SCHWARTZ
REAL J. FRADETTE

BY William E. Cleaver
ATTORNEY

MASS INTERCONNECTION DEVICE

Filed April 10, 1967 3 Sheets-Sheet 2

United States Patent Office 3,509,268
Patented Apr. 28, 1970

3,509,268
MASS INTERCONNECTION DEVICE

Leon Schwartz and Real J. Fradette, Philadelphia, Pa., assignors to Sperry Rand Corporation, New York, N.Y., a corporation of Delaware Filed Apr. 10, 1967, Ser. No. 629,637
Int. Cl. H05k 3/36, 1/14
U.S. Cl. 174—68.5 8 Claims

ABSTRACT OF THE DISCLOSURE

The present invention provides a plurality of electrically insulating material laminates each of which has individual printed circuits thereon and circuit connections therethrough. The laminates are provided with easy means for alignment and for easy connection to connecting pins passing therethrough. Accordingly a multi-layer printed circuit characterized by great flexibility is readily fabricated. In addition, the laminates are designed so that when fitted together a connecting pin passing through a stack thereof only comes in contact with one laminate and the pins can all be solder-connected to the proper laminate at one time.

This invention relates to a technique and a means for backboard wiring and/or any mass interconnection arrangement.

Background

In the prior art, multi-layer printed circuits have been fabricated by first etching each layer according to its proper pattern and stacking all of the layers to be secured together, or potted, into one member. Thereafter, the stacks were drilled from one layer through the other layers at the connecting pad positions. After the drilling, the layers were connected by plating through the circuits from one layer to another. The fabrication of such prior art multi-layer devices has required great skill in aligning the various circuits for "drilling-through" from one layer to another, and in effecting the plating through, so that good electrical connections could be made from one level of the multi-layer circuit to the next. In such a procedure, if a plating-through, or connection, is faulty it is not a simple matter to rework the connection through the layers and in such cases the circuitry would have to be discarded. Further, the fabrication of the prior art multi-layers has had very little flexibility once the design has been created. Accordingly, if a more desirable backboard wiring arrangement is created, in a prior art multi-layer device, it would have to be discarded. In addition in the prior art since the holes through the multi-layers are also the connecting holes, or terminal holes, of the layers, such prior art devices required the use of one layer each time the system had to accommodate a cross-over path. This will be more apparent hereinafter.

The present invention provides a means to fabricate multi-layer circuits for backboard wiring purposes or other mass interconnecting purposes which enables simple replacement of the through layer connections and great flexibility in altering the design, as well as simplicity of fabrication with respect to alignment. In addition, the present invention permits greater density of circuits per number of laminates because the through connections from one side of the laminate to the other are located in positions other than at the pin position.

Summary

The present invention provides a substrate (of electrically insulating material) into which a number of rectangularly shaped pins are molded. On one side of the substrate a first portion of each of the pins is located to provide means with which circuit cards are connected, and on the other side of the substrate the remaining portions of the pins are located. A plurality of printed circuit laminates are threaded over these other portions of the pins in such a fashion that where there is to be no connection between a connecting pad on the laminate and the pin, there is an oversized hole made in the laminate. The oversized hole envelops the pin and does not come into physical contact with the pin. When it is the intention of the system to make a connection between a connecting pad on the laminate and one of the pins, there is a rectangularly shaped hole (or a particularly shaped hole) formed in the respective pad providing a close fit over the pin. The rectangular holes not only provide a means for simple connection to the pins, but also provides a means for aligning the laminates with the pins. The laminates have printed circuits on both sides and are connected from one side to the other in areas of the laminates which do not lie in the pin positions. In between each of the laminates in a stack an insulation laminate is located, which has a hole pattern identical to its adjacent circuit laminate. The circuit paths of the system are simply connected within a laminate and not from one level to another.

The present invention can be better understood from the following description in conjunction with the drawings wherein.

Figure 5:
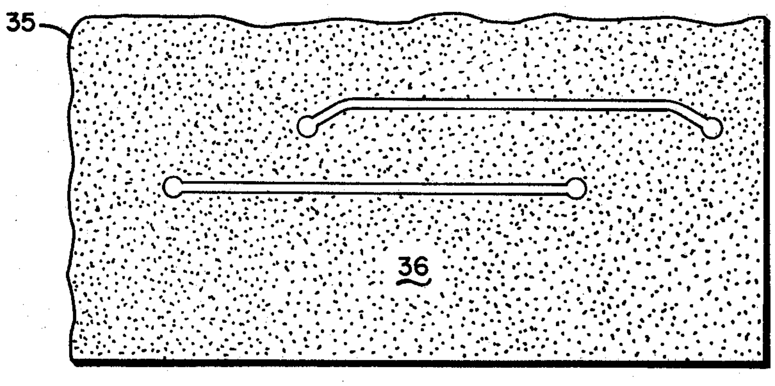
FIGURE 5 is a negative used to create a circuit on the back of the laminate.
Figure 8:
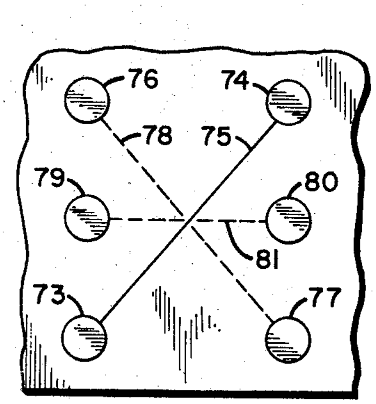
Figure 9:
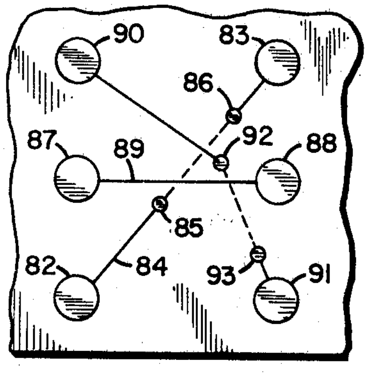
Figure 6:
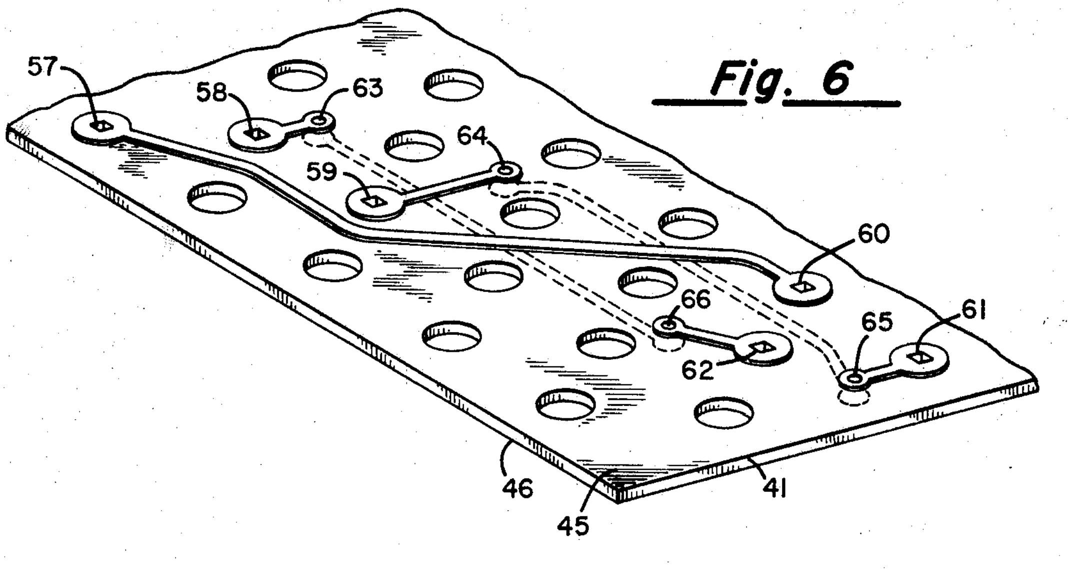
Figure 7:
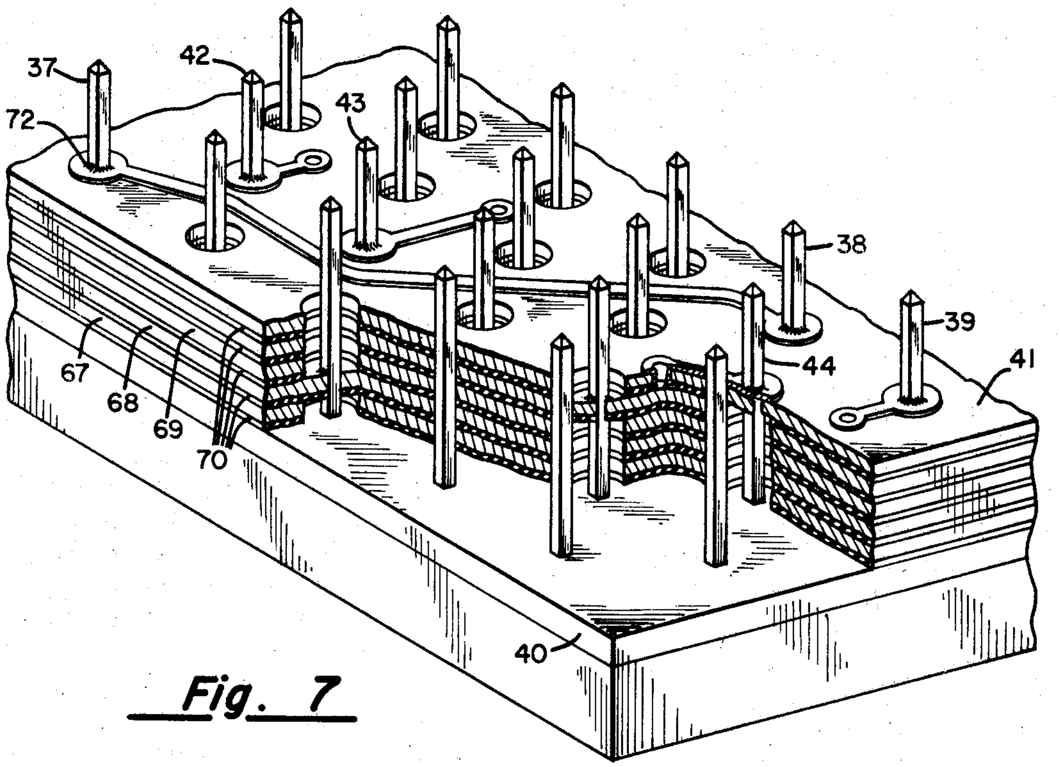

FIGURE 6 is a pictorial schematic of a laminate before it has been assembled with other laminates and whose circuit paths have been created by the use of the positives and negatives depicted in FIGURES 1–5; and FIGURE 7 is a pictorial schematic of a plurality of laminates threaded on the mounted pins and showing the printed circuits created by the photo-negatives and photo-positives of FIGURES 1–5 as shown on the laminate in FIGURE 6;

FIGURE 8 depicts a prior art conection between terminals on a multi-layer board;

FIGURE 9 depicts the pattern for connecting similar terminals to those in FIGURE 8 when the present invention is employed.

Figure 1:
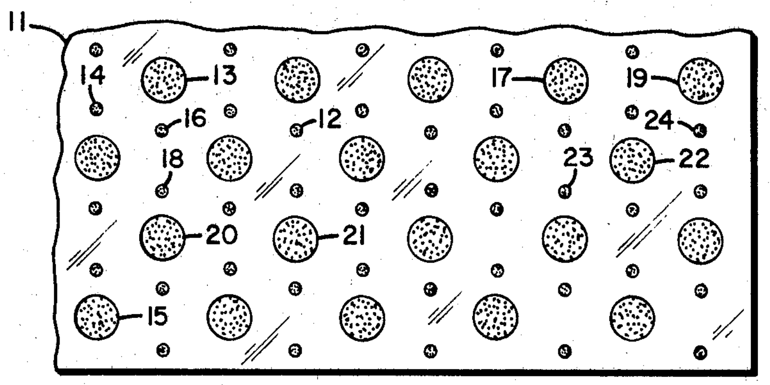
FIGURE 1 shows a photo-positive which is used with a photo-resist process in order to form the oversized holes and the through-holes in each laminate.

Consider first FIGURE 1. In FIGURE 1 there is shown a section of a photo-positive device 11 which is black or opaque to light in each area in which there is to be a hole created, such as hole areas 12–24 and the like. Although the other hole areas are not numbered it should be understood that on each occasion that there is shown a circle in FIGURE 1, there is to be a hole developed in the laminate with which it is used. Some of the holes will be oversized holes, such as the holes under areas 13, 15, 20, 21, 17, 19 and 22; while others of the holes will be connect-through holes such as the holes under the areas 12, 14, 16, 18, 23 and 24. The photo-positive 11 would be the size of the laminate with which it will be used and have as many oversized hole areas as there are pin positions in the mounting substrate upon which such a laminate is to be threaded. It will be noted that the oversized holes are staggered between alternate rows. This arrangement gives the advantage of simple printed circuit patterns, but it should be understood that a squared array of holes (or some other pattern) could be used and yet be within the spirit of the invention.

Before proceeding with the description of the remaining photo-positives and photo-negatives it should be understood that in the particular embodiment described herein there is photo-sensitive resist material used which is known in the trade as KPR, its proper name being Kodak Photo-sensitive Resist which is manufactured by the Kodak Company. This particular photo-resist operates such that when it is exposed to light and developed it will remain intact and act as a shield against the etchant material. In other words, the areas which are not subjected to light become "developed out" thus exposing (in the present device) the copper underneath, which copper is etched away when subjected to a copper etching solution such as ferric chloride acid or solder etch (which is a combination of chromic acid and sulfuric acid manufactured by the Philip Hunt Co.). It should be understood that other types of photo-sensitive resist can be used and in particular other types of photo-resist which work diametrically opposite from the photo-resist used in the present invention. In other words, some photo-resist materials work such that it is the areas which are not exposed to light that remain intact when developed and therefore become shields against etching materials.

Figure 2:
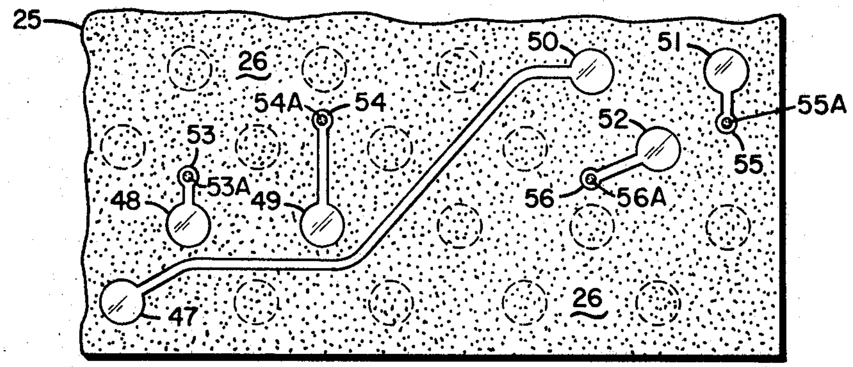
FIGURE 2 represents two devices used in the process, i.e., a photo-negative and a photo-positive of a circuit.

Carrying on with the discussion of figures, consider FIGURE 2. In FIGURE 2 there is shown a diagram which represents both a photo-positive device and a photo-negative device. For the purpose of simplicity only one diagram is shown, although it should be understood that in the actual operation there are two separate devices one of which has been formed as a photo-positive and the other which has been formed as a photo-negative. When the following discussion refers to the device 25 of FIGURE 2 and it is used as a photo-negative it should be understood that the areas 26 which areas are not defined by the solid line patterns will be black, or opaque to light, while the areas which are defined by the solid lines (and represent circuit paths) will be clear and allow light to be transmitted therethrough, excepting in the small circular areas 53A, 54A, 55A and 56A. On the other hand, when the device 25 is considered in the following discussion as a photo-positive then the area 26 will be clear and allow light to pass therethrough, while the areas surrounded by the solid lines including the small circular areas 53A, 54A, 55A and 56A, defining the circuit paths, will be black or opaque to light. In other words the entire circuit paths of device 25 (FIGURE 2) including the circular areas 53A, 54A, 55A and 56A will be opaque.

Figure 3:
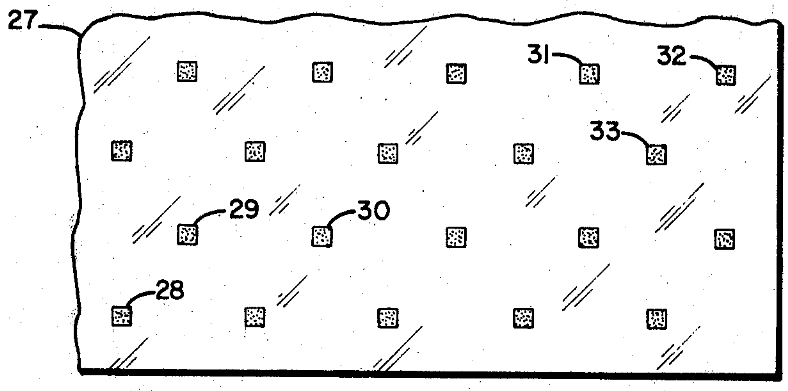
FIGURE 3 is a photo-positive of rectangular areas which in combination with the device of FIGURE 2 enables rectangular holes to be made with particular connecting pads.
Figure 4:
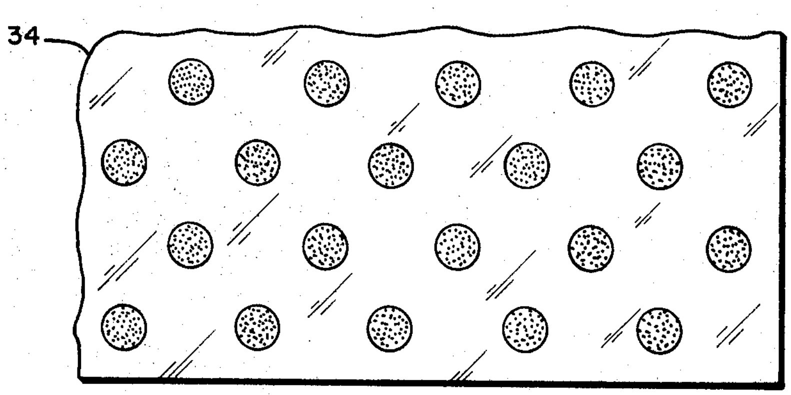
FIGURE 4 is a photo-positive similar to that shown in FIGURE 1 but without the through holes areas included.

FIGURE 3 shows a photo-positive 27 whereupon there have been developed rectangular black areas, or opaque areas, for each of the locations in which there is an oversized hole area in the photo-positive 11 (FIGURE 1). The rectangular areas such as areas 28–33 are means by which square holes will be created within pad areas of the printed circuit. This will become more apparent hereinafter. FIGURE 4 shows a photo-positive 34 which is similar to the photo-positive of FIGURE 1, excepting that the connect-through hole areas are not included in this positive. FIGURE 5 depicts a photo-negative 35 which has an area 36 which is black or opaque to light and in which the circuit patterns, surrounded by the solid lines, are clear and permit light to pass therethrough.

Consider now FIGURE 7 which shows a mounting substrate, or a housing means, into which a number of rectangularly shaped pins have been molded. The assembly of FIGURE 7 provides some idea of the end product which is to be created by using the photo-positives and photo-negatives depicted in FIGURES 1–5. In FIGURE 7 the pins such as pins 37, 38 and 39, as well as the others, have lower sections (not shown) which emanate from the other side of the board 40. It is to the undersides of these pins that the printed circuit cards, or the integrated circuit wafers, are connected. Each of the pins such as pins 37 and 38 and the like is shown to be rectangular in shape. It should be understood that other shaped pins could be used such as hexagonal, octagonal, etc. In the preferred embodiment the pins are shaped to have some square edges and are formed to be quite small with respect to the over-sized holes created by the photo-positive shown in FIGURE 1. It will be noted that the top laminate 41 of the stack has a circuit pattern thereon which is identical with the circuit pattern shown in FIGURE 2 and is connected to the pins 37, 42, 43, 38, 39 and 44. Let us therefore consider the fabrication of the laminate 41.

Laminate 41 is shown in FIGURE 6. The laminate 41 is fabricated by first taking a sheet of copper-clad glass-epoxy, which has the copper clad on both sides thereof, and subjecting both sides of it to a photo-sensitive resist material, in particular the material KPR described earlier. The copper clad glass-epoxy can be obtained from many maunfacturers and in the preferred embodiment it is identified as G10 and is manufactured by the General Electric Corporation. The copper coating is approximately $\frac{1}{1000}$ of an inch thick while the glass epoxy is approximately $\frac{4}{1000}$ of an inch thick.

In the fabrication process the laminate has both surfaces 45 and 46 overlaid with the photo-positive 11 shown in FIGURE 1. Thereafter each of the surfaces 45 and 46 is subjected to light and it is only the oversized hole areas and the connect-through areas which do not permit the light to strike the photo-resist material. Hence, it is only these last-mentioned areas which can be "developed out" or removed when the laminate is "developed." The second step includes combining the photo-positive 27 of FIGURE 3 with the photo-negative 25 of FIGURE 2. Two such combinations are put together and overlaid on each of the surfaces 45 and 46. Once again the surfaces are subjected to light and now the portion of the area under the hole area 15 in FIGURE 1 will be subjected to the light passing through the pad area 47 of FIGURE 2. But all of the light incident to the pad area 47 will not pass therethrough because a portion of it will be blocked by the rectangular area 28 of FIGURE 3. Accordingly, a small rectangular area under the hole area 15 will remain unsubjected to light and therefore will be capable of being "developed out." Similar rectangular areas are also unaffected (from the light) under the oversized areas 20, 21, 17, 19 and 22, respectively, by the clear pad areas 48, 49, 50, 51 and 52 in combination with the rectangular areas 29, 30, 31, 32 and 33 of FIGURE 3. In addition the connect-through holes at locations 12, 18, 23, and 24 (FIGURE 1) remain unexposed because these locations have been protected by the opaque circles 53A, 54A, 55A and 56A.

The object of step 3 is to develop connect-through holes under the pad locations 53, 54, 55 and 56 in FIGURE 2. It will be recalled that each of the connect-through hole areas which were shielded from the light by the photo-positive 11 (FIGURE 1) is capable of being developed out and the purpose of the printed circuit might be defeated if this were permitted to happen. Accordingly, in step 3 the photo-positive 34 is combined with a photo-positive 25 of FIGURE 2. It will be recalled that earlier it was indicated that the item 25 would represent both a photo-positive and a photo-negative. The combination of the photopositive 34 and the photo-positive 25 is arranged on both sides of the laminate 41 and once again both sides are exposed to light. In accordance with this last step each of the connect-through hole areas is subjected to light and therefore cannot be developed out, excepting those connect-through hole areas which lie under the pads 53, 54, 55, 56.

Now the laminate is ready for being "developed." The laminate is developed in some suitable developing material and that portion of the resist which has been exposed to light is firmed up to protect the copper from being etched away when the laminate is dipped in the copper etchant bath. The laminate is then dipped in the ferric chloride acid bath and the copper of each of the oversized holes is etched away with the exception of those positions under the pad areas 47, 48, 49, 50, 51 and 52, but including the rectangular areas under the last mentioned pad areas. At this juncture it should be recognized that the laminate for the most part is still a relatively solid sheet of copper with simply the oversized holes, the through holes and the rectangular holes etched therefrom. There has been no circuit pattern etched thereon. Next the laminate is subjected to a bath of sulphuric acid which attacks the resin of the glass epoxy and finally the laminate is subjected to a bath of hydrofluoric acid which etches away the glass. Accordingly, the holes are etched through the laminate.

The fourth step is that of stripping the resist. The resist material can be stripped by employing a material identified as SK4 which is manufactured by the London Chemical Company. Other stripping material, however, can be used. After the laminate has been stripped, the plate is subjected to an electroless plating process to provide a thin coating of copper through the holes. Thereafter the plate is subjected to an electroplate tank wherein the thickness of the copper is built up. The laminate with the plated-through holes is then subjected to a new coat of photo-resist material.

After a new layer of photo-resist material has been applied the front surface 45 is overlain with the photo negative 25 and the back surface 46 with a photo-negative 34 of FIGURE 5. Once again both sides are subjected to light and now the circuit paths depicted in FIGURES 2 and 5 are subjected to light and this portion of the copper is conditioned to accept or be bonded to solder when the laminate is plated in a solder bath. The laminate is then developed. The laminate is next plated in the solder bath and the circuits have solder built up thereon. Next the resist is removed from the background, i.e., the area outside of the circuit paths. The solder-covered-copper is then subjected to an etchant bath and the solder-covered-copper which remains on the laminate is that which is shown in FIGURE 6. The etchant can be that mentioned earlier as manufactured by the Philip Hunt Company.

In FIGURE 6 the square holes 57–62 have been respectively developed under the pads 47–52. In FIGURE 6 the through holes 63–66 have been developed respectively under the pads 53–56.

The laminate 41 is now ready for its assembly with the other laminates and for its assembly with accompanying insulation sheets, whose fabrication will be described immediately hereinafter.

As was suggested earlier each of the circuit laminates has an accompanying insulation sheet which is also made of glass-epoxy but whose thickness is approximately $\frac{2}{1000}$ of an inch. The fabrication of the insulation sheet is quite similar to that of the circuit laminate excepting for the last two steps. In other words, a copper clad laminate whose glass-epoxy interlayer is only $\frac{2}{1000}$ of an inch is first covered on both surfaces by a photo-resist material and photo-positive 34 such as the photo-positive shown in FIGURE 4. The laminate is subjected to light and accordingly the oversized hole areas under the oversized hole areas of the photo-positive 34 are capable of being removed during developing. The second state of fabricating the insulation layer is to combine the photo-negative 25 of FIGURE 2 with the photo-positive 27 of FIGURE 3, and put a combination of this type on each surface of the laminate and subject the laminate to light. Accordingly, the proper rectangular holes will be made ready for being developed out. Next the laminate is subjected to a bath of ferric chloride acid at which point the copper under the oversized holes and in the particular square hole areas, determined by the circuit path of FIGURE 2, will be etched out. Next the laminate is subjected to a bath of sulfuric acid which dissolves the resin in a glass epoxy and finally the laminate is subjected to a hydrofluoric acid bath which etches out the glass material. Accordingly the laminate is a relatively complete sheet of copper with the oversized holes and the properly located square holes etched therefrom. Next the photo-resist is peeled off with the use of SK4 as indicated earlier. Thereafter, the laminate is subjected to a ferric chloride acid bath and all of the copper is removed leaving $\frac{2}{1000}$ of an inch laminate of glass epoxy with oversized holes and properly designated rectangular holes located therein.

In FIGURE 7 there is shown circuit layers 67, 68, 69 and 41 in between which there are located accompanying insulation layers 70. Each of the insulation layers 70 is an oversized hole and square hole image of its associate circuit laminate.

Assuming that many such laminates, (but of different patterns with different connection pads), have been fabricated, the laminates are then threaded on the pins as shown in FIGURE 7. The pins go through the square holes and readily permit alignment of the laminates insofar as the square holes and oversized holes are concerned. It is important to note that the patterns are so designed that each pin comes in contact with only one laminate.

It can be easily seen in FIGURE 7 that the areas of the laminates which are not in conductive relationship with the pins have oversized holes which are not in physical contact with the pins. On the other hand, where the circuits are to be in connection with pins, such as at hole 57 (FIGURE 6) there is shown a connection 72 between the hole 57 and the pin 37. The pin originally has a tight fit in the square hole and is easily solder-connected onto the pin. As far as can be seen in FIGURE 7 the pins make connection (in the preferred embodiment) with only one laminate per pin. Accordingly, when the laminates have been threaded on the pin, solder rings are slipped over the pins and pass through the oversized holes until they reach a square hole at which point it was intended that the pin would be connected to the laminate. Accordingly, when all of the solder rings have been dropped in place, the stack can be heated and the solder simply makes a connection between the pin and its associated laminate. It is conceivable that a stack could be made in a two or a three step operation whereby a plurality of such soldering steps could be incorporated and hence the pins could be in contact with more than just a single laminate.

However in the preferred embodiment the single laminate technique is employed because it has other advantages. For instance it becomes apparent after the circuit has been in use or before it has been in use, that a particular connection between a circuit board connected to the undersides of the pin and the laminate is no longer desirable. When such a condition is recognized a sleeve cutter is slipped over the pin whereby the laminate connection that is no longer desirable is cut away. The sleeve cutter simply cuts away the connection and the pin now has a laminate with an additional oversized hole.

The pin is still connected to the circuit card on the underside but is no longer connected with the laminate. A wire connection can then be made to this pin which wire connection can be made to an additional pin to complete a more desirable circuit.

A second advantage of this arrangement is that if any of the pins become mutilated such a pin can simply be pulled from the molding and have a new pin dress fitted thereinto. A third advantage of this arrangement is that if a complete laminate or laminates need be removed during assembly it is a simple matter to remove the laminates to be replaced. On the other hand, if such a procedure is not desirable it is a simple matter to cut out the connections of a single laminate since all of its connections are only to individual pins to refabricate the laminate and add a new laminate to the top of the stack as a substitution.

Another advantage of this arrangement is found in the concept of having the through connections other than where the pin connections are made and having each laminated circuit-connected on each side. For instance, consider FIGURE 8 which shows a connection between six terminals in a prior art multi-layer printed circuit. The connection between terminals 73 and 74 is made on the top of the first layer as shown by the solid line 75. A connection between the terminals 76 and 77 must be made on a second layer and is shown by the dashed line 78. The connection between the terminal 79 and 80 must be made on a third layer and is shown by the dashed line 81. Hence, it becomes apparent that in the prior art if a connection were made between six terminals three layers were necessary. However, with the connect-through holes being other than at the terminal locations we find that with the present invention a scheme such as that shown in FIGURE 9 may be effected. Note that the connection between the terminals 82 and 83 is made on top of the laminate from the terminal 82 along the line 84 to the connect through hole 85. Thereafter the circuit is connected on the rearside between the connect hole 85 and the connect hole 86 and on the top surface between the connect hole 86 and the terminal 83. The connection between the terminals 87 and 88 is made of the top surface as indicated by the solid line 89. The connection between the terminals 90 and 91 is made on the top surface between the terminal 90 and the connect hole 92, then along the rear of the laminate to the connect hole 93 and subsequently on the upper surface between the connect hole 93 and the terminal 91. Hence, it becomes apparent that the connections between the six terminals can be made on one laminate. Accordingly, the present invention permits much greater density for cubic unit of packaging. This gives rise to advantages in cost, space and weight.

In the preferred embodiment, the circuit pads are approximately $^{90}/_{1000}$ of an inch in diameter while the connect-through pads are $^{40}/_{1000}$ of an inch in diameter. The clearance between the pads is approximately $^{78}/_{1000}$ of an inch, while the conductors are $^{15}/_{1000}$ of an inch. The drawings are greatly exaggerated to help with the explanation. While the above dimensions are used in the preferred embodiment, these dimensions are not a limitation.

The embodiments of the invention in which an exclusive property or privilege is claimed are defined as follows:

1. A mass electrical interconnection device comprising in combination: a plurality of connector pins; mounting means holding said connector pins according to a particular pattern; a plurality of circuit laminates made of electrically insulating material, each of said laminates having electrical current path means secured to a portion thereof with the remainder of the laminate being electrically non-conductive; a plurality of first apertures and a plurality of second apertures located in each of said circuit laminates according to said particular pattern, each of said first apertures being larger than a cross section of any one of said connector pins, each of said second apertures snugly fitting over an associated one of said connector pins; each of said second apertures being formed only in said electrical current path means of its associated laminate and according to a pattern with each connector pin passing through no more than one of said second apertures; and said circuit laminates being disposed in a stack on said connector pins having each of said connector pins clearly passing through associated ones of said first apertures and snugly passing through a single one of said second apertures connecting certain of said current path means between certain of said pins in accordance with the circuit path means on different ones of said laminates.

2. A mass electrical interconnection device according to claim 1 wherein there is further included means connecting each of said connector pins which is designated for electrical interconnection with a single one of said circuit means.

3. A mass electrical interconnection device according to claim 1 wherein there is further included a plurality of insulating laminates fabricated of electrically insulating material, each of said insulating laminates having a plurality of said first apertures with one each located in a connector pin position according to said particular pattern; said plurality of insulating laminates interleaved between said circuit laminates to provide one layer of electrical insulation between any adjacent circuit laminates in said stack.

4. A mass electrical interconnection device according to claim 1 wherein said electrical current path means are arranged on each of said laminates with respect to each of said electrical current path means on the other of said laminates to provide that any one of said connector pins can be connected to a current path means on only one of said laminates.

5. A mass electrical interconnection device according to claim 1 wherein each of said circuit laminates has first and second sides with a first current path means disposed on said first side and a second current path means disposed on said second side and wherein each of said circuit laminates has circuit connection means placed through said laminates interconnecting said first current path means to said second current path means at positions other than those positions corresponding to the connector pin positions of said particular pattern.

6. A mass electrical interconnection device according to claim 1 wherein said second apertures have the shape of said connecting pins.

7. A mass electrical interconnection device according to claim 1 wherein said connector pins extend from the side of said mounting means lying opposite said circuit laminates.

8. A means for electrically interconnecting pin elements according to claim 1 wherein each of said laminates has first and second sides, said first side having a first electrical current path means thereon and said second side having a second electrical current path means thereon; and wherein there is further included a plurality of electrical connector elements, said connector elements formed in said first and second current paths on said substrate means at locations other than the locations of said first and second apertures to connect said first electrical current path means with said second electrical current path means.

References Cited

UNITED STATES PATENTS

| | | | |
|---|---|---|---|
| 3,022,480 | 2/1962 | Tiffany | 339—18 |
| 3,184,830 | 5/1965 | Lane et al. | |
| 3,296,362 | 1/1967 | Parry | 174—88 |

D. L. CLAY, Primary Examiner

U.S. Cl. X.R.

29—626; 317—101